(12) United States Patent
Noda et al.

(10) Patent No.: US 7,639,720 B2
(45) Date of Patent: Dec. 29, 2009

(54) TWO-DIMENSIONAL PHOTONIC CRYSTAL SURFACE EMITTING LASER

(75) Inventors: Susumu Noda, Uji (JP); Jun-ichi Kashiwagi, Katanu (JP); Dai Ohnishi, Kyoto (JP); Wataru Kunishi, Kyoto (JP)

(73) Assignees: Kyoto University, Kyoto (JP); Rohm Co. Ltd., Kyoto (JP)

( * ) Notice: Subject to any disclaimer, the term of this patent is extended or adjusted under 35 U.S.C. 154(b) by 102 days.

(21) Appl. No.: 12/076,939

(22) Filed: Mar. 25, 2008

(65) Prior Publication Data
US 2008/0240193 A1    Oct. 2, 2008

(30) Foreign Application Priority Data
Mar. 26, 2007    (JP) .............................. 2007-079640

(51) Int. Cl.
*H01S 5/00*    (2006.01)
*H01S 3/08*    (2006.01)

(52) U.S. Cl. ...................................... 372/49.01; 372/99
(58) Field of Classification Search ............. 372/49.01, 372/99
See application file for complete search history.

(56) References Cited

FOREIGN PATENT DOCUMENTS

| JP | A-2000-332351 | 11/2000 |
|----|---------------|---------|
| JP | A-2003-273456 | 9/2003  |

*Primary Examiner*—Armando Rodriguez
(74) *Attorney, Agent, or Firm*—Oliff & Berridge, PLC

(57) ABSTRACT

The two-dimensional photonic crystal surface emitting laser according to the present invention includes a semiconductor substrate, a main laser section and a reflection film. The main laser section includes a lower cladding layer, an active layer, a two-dimensional photonic crystal layer, an upper cladding layer and a contact layer, which are all deposited on the semiconductor substrate. The reflection film, which surrounds the entire side surfaces of the main laser section, is made of a thin titanium-gold film deposited by sputtering.

6 Claims, 4 Drawing Sheets

(A)

(B)

(A)

(B)

TWO-DIMENSIONAL PHOTONIC CRYSTAL SURFACE EMITTING LASER

TECHNICAL FIELD

The present invention relates to a two-dimensional photonic crystal surface emitting laser that emits laser light in a direction perpendicular to an active layer.

BACKGROUND OF THE INVENTION

Surface emitting lasers emit laser light in a direction perpendicular to the surface of their substrate and are expected as a light source that can be integrated (or arrayed). One such surface emitting laser is a surface emitting laser using a two-dimensional photonic crystal. A two-dimensional photonic crystal consists of a dielectric body material in which areas ("modified refractive index areas") whose refractive index differs from that of the body material are periodically arranged. The periodic structure causes a Bragg diffraction within the two-dimensional photonic crystal and creates an energy region ("photonic band gap") in which the transmission of light (or electromagnetic waves) is disallowed.

For example, a two-dimensional photonic crystal surface emitting laser disclosed in Patent Document 1 includes a slab-shaped two-dimensional photonic crystal located in the vicinity of an active layer which emits light when carriers are injected into it. In this two-dimensional photonic crystal, the period distance of the modified refractive index areas are determined so that it equals the wavelength that the light generated within the active layer will have within the two-dimensional photonic crystal. Therefore, a two-dimensional standing wave is created within the two-dimensional photonic crystal, whereby the light is amplified and causes a laser oscillation.

While the two-dimensional standing wave is present within the two-dimensional photonic crystal, a portion of light leaks from the lateral side of the crystal. This leads to efficiency deterioration due to the loss of energy and heat generation attributed to absorption of the leaking light by the active layer, with the result that the minimum level of current necessary for laser oscillation (i.e. the "lasing threshold") increases.

For solving this problem, Patent Document 2 discloses a two-dimensional photonic crystal surface emitting laser including a reflector surrounding the two-dimensional photonic crystal to abate the lateral leakage of light.

Patent Document 1: Japanese Unexamined Patent Application Publication No. 2000-332351 (Paragraphs [0037] through [0056], FIG. 1)

Patent Document 2: Japanese Unexamined Patent Application Publication No. 2003-273456 (Paragraphs [0023] through [0034], FIGS. 1 through 3)

The two-dimensional photonic crystal surface emitting laser disclosed in Patent Document 2 includes upper and lower cladding layers formed on a semiconductor substrate, an active layer sandwiched between the two cladding layers, and a two-dimensional photonic crystal located on one of the cladding layers or on the active layer. The aforementioned reflector consists of a groove extending from the upper cladding layer to the lower one, or holes functioning as a diffraction grating or two-dimensional photonic crystal.

The aforementioned groove or holes can be created by photolithography, electron-beam lithography or similar techniques. In creating the groove or holes, it is necessary to accurately control their distance from the edge of the photonic crystal because this distance significantly affects the phase of the reflected light waves; an inaccurate distance setting possibly deteriorates the device performance.

SUMMARY OF THE INVENTION

A problem to be solved by the present invention is to provide a two-dimensional photonic crystal surface emitting laser having a high level of light-use efficiency yet easy to produce.

To solve the aforementioned problem, the two-dimensional photonic crystal surface emitting laser according to the present invention includes a semiconductor substrate, a main laser section having an active layer and a two-dimensional photonic crystal layer, both layers being provided on the semiconductor substrate, and a reflection film made of either a thin metallic film or dielectric multi-layer film covering the entire side surfaces of the main laser section.

In the two-dimensional photonic crystal surface emitting laser according to the present invention, the reflection film covering the entire side surfaces of the main laser section not only reduces the leakage of light from the end faces of the two-dimensional photonic crystal but also prevents the light passing through the active layer and the cladding layers from leaking in the direction parallel to the substrate. The present invention is particularly advantageous in the situation where the crystal face area of the photonic crystal is reduced. In conventional two-dimensional photonic crystal surface emitting lasers, the aforementioned situation causes an increase in the lasing threshold since an adequate feedback effect for laser oscillation cannot be obtained. The technique according to the present invention impedes this increase in the lasing threshold that would otherwise accompany the reduction in the size of the photonic crystal. Accordingly, the element area can be made smaller, which is advantageous for densely arraying the elements.

Covering the entire side surfaces of the main laser section with a reflector made of either a thin metallic film or dielectric multi-layer film is an easy process, which will stabilize the characteristics of the resulting two-dimensional photonic crystal surface emitting lasers.

For a device in which the light-emitting direction is identical to the direction from the two-dimensional photonic crystal layer to the semiconductor substrate and an electrode is provided on the top surface of the main laser section, it is preferable that the reflection film should further entirely cover the top surface of the main laser section except for the portion where the electrode is located.

In the case where the reflection film is a thin metallic film, the reflection film is provided further on the entire top surface of the main laser section, and an insulating film is provided between the outer surface of the main laser section and the reflection film except for a portion of the top surface of the main laser section. In this construction, the reflection film located at that portion of the top surface of the main laser section functions as the electrode.

DETAILED DESCRIPTION OF PREFERRED EMBODIMENTS

The following sections describe specific embodiments of the two-dimensional photonic crystal surface emitting laser according to the present invention using the attached drawings.

First Embodiment

Figure 1:
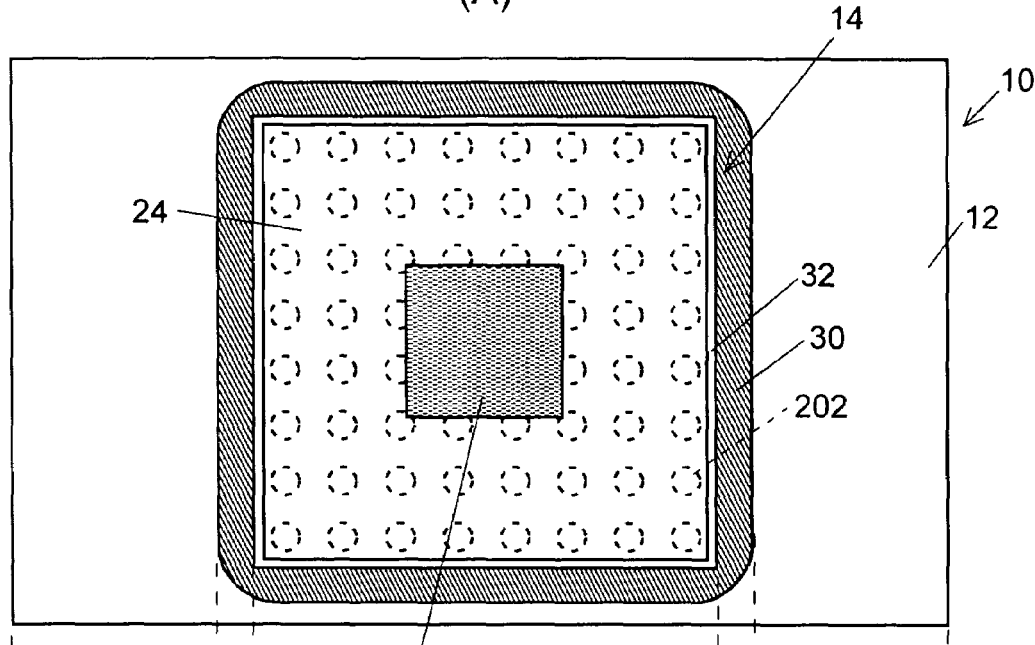
FIG. 1 shows the first embodiment of the present invention, including (a) a plain view and (b) vertical sectional side view of a two-dimensional photonic crystal surface emitting laser.
Figure 1:
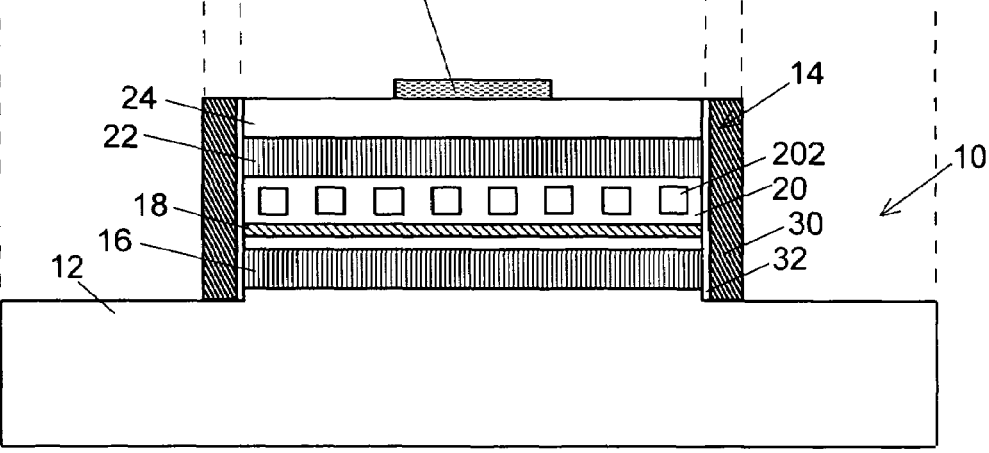

As shown in FIG. 1, the two-dimensional photonic crystal surface emitting laser 10 according to the first embodiment of the present invention includes a semiconductor substrate 12 made of n-type gallium-arsenide (GaAs) and a main laser section 14 mounted on it. The main laser section 14 includes (in the following order) a lower cladding layer 16, an active layer 18, a photonic crystal layer 20, an upper cladding layer 22 and a contact layer 24, which are deposited on the semiconductor substrate 12. This section has a mesa structure created by etching. The lower cladding layer 16 is an n-type semiconductor made of aluminum gallium-arsenide (AlGaAs). The upper cladding layer 22 is a p-type semiconductor made of AlGaAs.

The active layer 18 consists of a conductor made of indium gallium-arsenide (InGaAs)/gallium-arsenide (GaAs) in which multiple-quantum wells (MQW) are present. The active layer 18 emits light when carriers (electrons and holes) are injected into it. The cladding layers 16 and 22 function as conductive layers which the carriers to be fed to the active layer 18 pass through. For this purpose, the cladding layers 16 and 22 are located on both sides of the active layer 18.

The two-dimensional photonic crystal layer 20 is made of a slab-shaped body material in which areas whose refractive index differs from that of the body material (i.e. modified refractive index areas) are periodically arranged in a square lattice pattern. The shape and material of the modified refractive index areas may be randomly chosen. In the present embodiment, each modified refractive index area consists of a cylindrical hole 202.

The contact layer 24 is a conductor made of p-type GaAs. An upper electrode 26 is provided on the upper surface of the contact layer 24, whereas a lower electrode (which is not shown) is provided on the lower surface of the substrate 12.

The semiconductor substrate 12 and the cladding layers 16 and 22 are transparent to the light to be emitted. This means that the present surface emitting laser 10 emits light from the lower surface of the semiconductor substrate 12.

The previously described main laser section 14 has its outer circumferential surface entirely covered with a reflection film 30. This coating 30 is a thin titanium-gold (Ti—Au) film deposited by sputtering or other methods. Since the titanium-gold film is electrically conductive, an insulating film 32 is provided between the reflection film 30 and the main laser section 14.

In the present embodiment, similar to the reflection film 30, the upper electrode 26 and the lower electrode are thin titanium-gold films deposited by sputtering.

In the surface emitting laser 10 of the present embodiment, when a voltage is applied between the lower electrode and the upper electrode 26 to generate current between them, the electrons and holes thereby introduced into the device recombine with each other within the active layer 18 and generate light. Among the components of light generated in the active layer 18, a specific wavelength of light forms a standing wave within the two-dimensional photonic crystal layer 20 and is amplified, resulting in a laser oscillation. The laser light is emitted from the lower surface of the substrate 12.

In this process, due to the reflection film 30 covering the entire side surfaces of the main laser section 14, both the light generated within the active layer 18 and the standing wave formed in the two-dimensional photonic crystal layer 20 are confined within the main laser section 14. Thus, the light loss is reduced.

Figure 2:
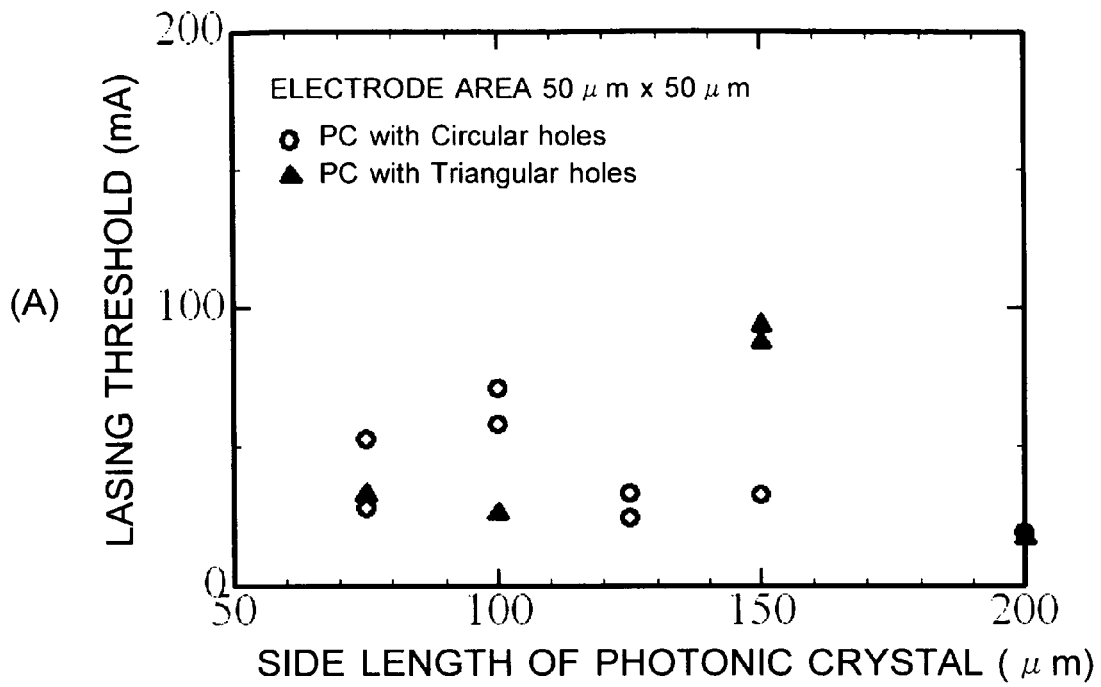
FIG. 2(a) shows the relationship between the lasing threshold and the side length of a photonic crystal in the case where an electrode whose side length was 5 µm.
FIG. 2(b) shows the relationship between the lasing threshold and the side length of a photonic crystal in the case where an electrode whose side length was approximately equal to that of the photonic crystal.
Figure 2:
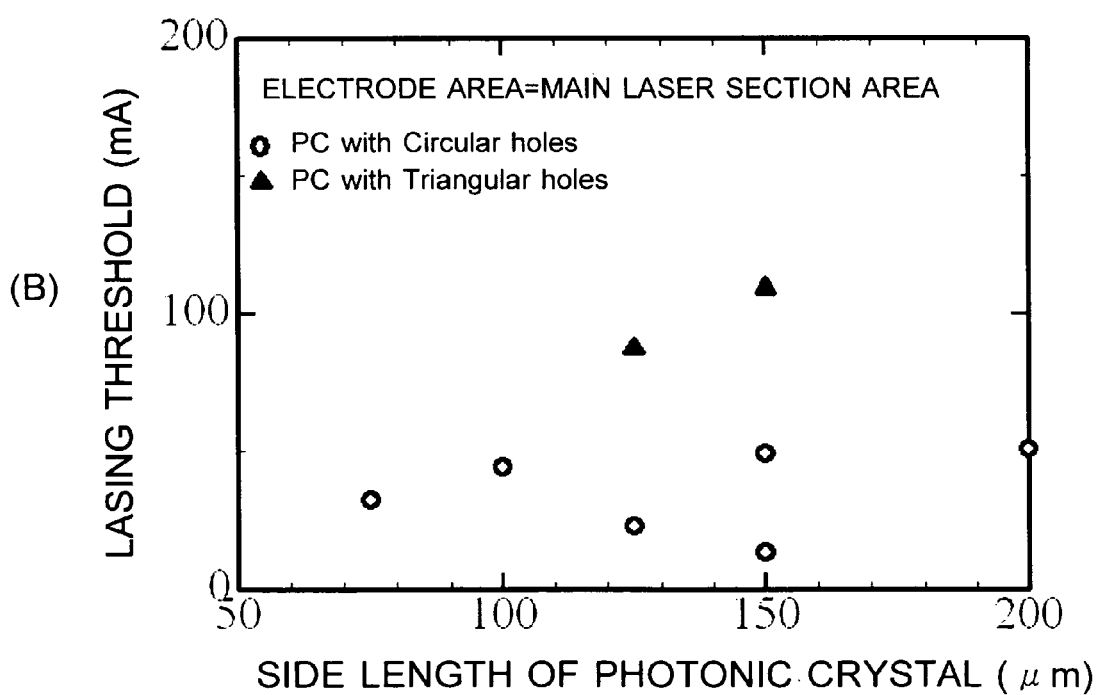
Figure 3:
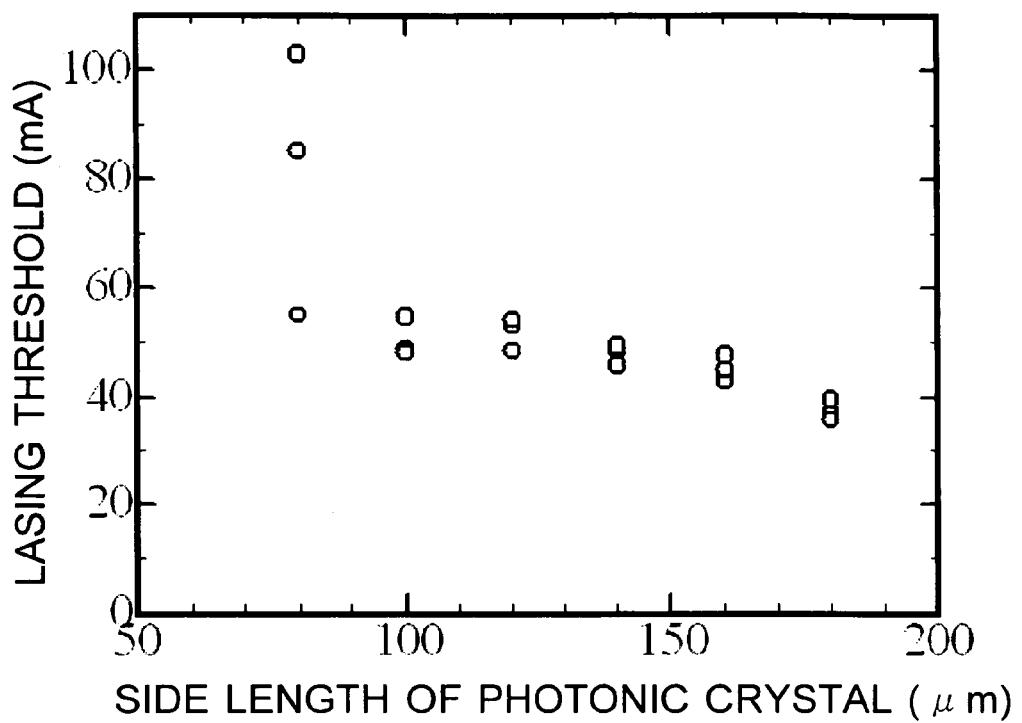
FIG. 3 shows the relationship between the lasing threshold and the side of the photonic crystal of a surface emitting laser without a reflection film.

FIGS. 2 and 3 show the measurement results demonstrating the relationship between the lasing threshold and the side length of a photonic crystal (i.e. the side length of the main laser section) for the surface emitting laser 10 in the present embodiment and another surface emitting laser without the reflection film (comparative example). In the surface emitting laser shown in FIG. 2A, the side length of the electrode was 50 µm, whereas, in the surface emitting laser shown in FIG. 2B, the side length of the electrode was approximately equal to that of the photonic crystal. FIGS. 2A and 2B each show the lasing threshold of a photonic crystal with circular holes and those of a photonic crystal with triangular holes. In the surface emitting laser shown in FIG. 3 as the comparative example, the side length of the electrode was 50 µm and the hole shape of the photonic crystal was triangular.

As shown in FIGS. 2 and 3, in the surface emitting laser without the reflection film, the lasing threshold tends to increase as the side length of the photonic crystal decreases. Particularly, the lasing threshold remarkably increased when the side length of the photonic crystal was 80 µm. On the other hand, in each surface emitting laser of the present embodiment, the lasing threshold did not increase with the decrease in the side length of the photonic crystal; there was no correlation between the two properties.

This is most likely because the surface emitting laser with the reflection film can efficiently use light generated in the active layer, irrespective of the size of the photonic crystal. Accordingly, the surface emitting laser according to the present can be miniaturized.

Second Embodiment

Figure 4:
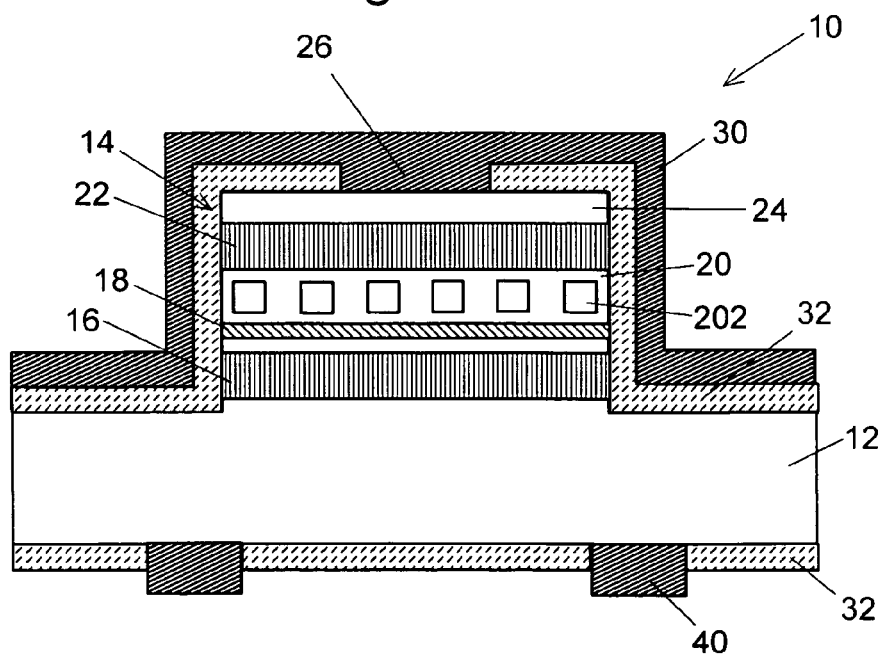
FIG. 4 is a vertical sectional side view showing the structure of a two-dimensional photonic crystal surface emitting laser according to the second embodiment of the present invention.
Figure 5:
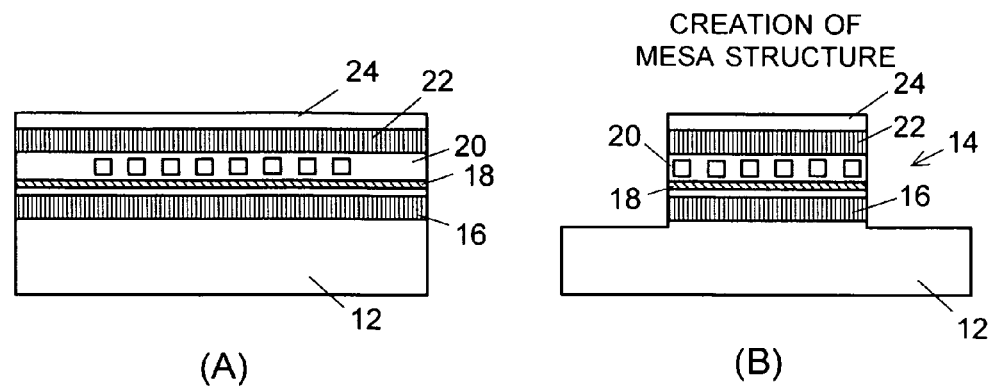
FIG. 5 shows a manufacturing process.
Figure 5:
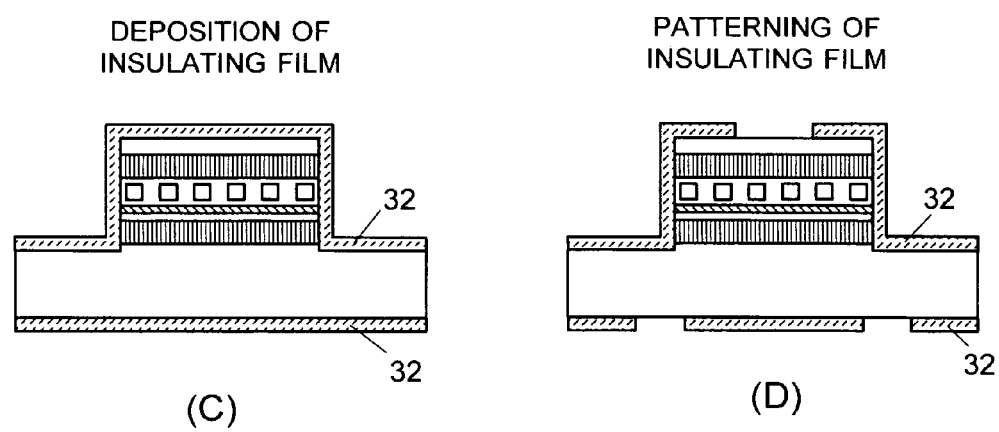
Figure 5:
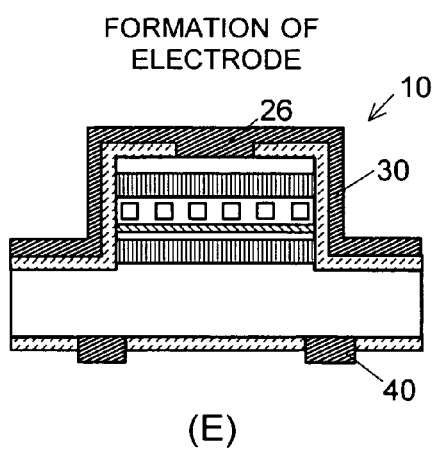

This section describes the second embodiment of the present invention using FIGS. 4 and 5. FIG. 4 shows the surface emitting laser according to the present embodiment. In the surface emitting laser 10 of this embodiment, the reflection film 30 is provided on the top surface and side surfaces of the main laser section 14 and the upper surface of the substrate 12. As in the first embodiment, the reflection film 30 is made of a thin titanium-gold film.

In addition, an insulating film 32 is provided between the main laser section 14 and the reflection film 30 and also between the substrate 12 and the reflection film 30 except for a portion of the top surface of the main laser section 14. Accordingly, the reflection film 30 is in contact with the main laser section 14 at that portion of the top surface of the main laser section 14, while the reflection film 30 is separated from the main laser section 14 by the insulating film 32 at the other portions. The reflection film 30 located at the aforementioned portion of the top surface of the main laser section 14 also functions as the electrode 26.

The reflection film 30 provided on the top surface of the main laser section 14 reflects light traveling in a direction opposite to the light-emitting direction and thereby confines the light within the main laser section 14.

FIG. 5 shows a manufacturing process of the surface emitting laser 10 of the present embodiment. Initially, the lower cladding layer 16, active layer 18, photonic crystal layer 20, upper cladding layer 22 and contact layer 24 are deposited on the semiconductor substrate 12 in this order (FIG. 5A), whereafter a mesa structure is created by etching (FIG. 5B). Thus, the main laser section 14 is created.

Subsequently, the insulating film 32 is deposited on the side surfaces and top surface of the main laser section 14 and the upper and lower surfaces of the substrate 12 (FIG. 5C), and patterning for the electrode portion is performed (FIG. 5D). Finally, a thin titanium-gold film is deposited on the side surfaces and top surface of the main laser section 14 and the upper surface of the substrate 12 by sputtering, whereby the reflection film 30 and the upper electrode 26 are created (FIG. 5E).

Thus, in the surface emitting laser 10 of the present embodiment, it is possible to simultaneously create the reflection film 30 and the electrode 26. Thus, the manufacturing process is simplified.

It should be noted that the materials of the active layer, two-dimensional photonic crystal layer and other layers mentioned in the previous embodiments are mere examples. For those layers, various materials used in conventional two-dimensional photonic crystal surface emitting laser light sources are also available in their original forms.

In the two-dimensional photonic crystal layer, the modified refractive index areas may be created by arranging members whose refractive index differs from that of the body material.

The reflection film may be a dielectric multi-layer film (e.g. a distributed Bragg reflector: DBR). This configuration eliminates the necessity of separately providing an insulating film in addition to the reflection film since the dielectric multi-layer film will also function as the insulating film.

What is claimed is:

1. A two-dimensional photonic crystal surface emitting laser, comprising:
    a semiconductor substrate;
    a main laser section having an active layer and a two-dimensional photonic crystal layer, both layers being provided on the semiconductor substrate; and
    a reflection film made of either a thin metallic film or dielectric multi-layer film covering the entire side surfaces of the main laser section.

2. The two-dimensional photonic crystal surface emitting laser according to claim 1, comprising:
    an electrode provided on a top surface of the main laser section, where:
    the reflection film further entirely covers a top surface of the main laser section except for a portion where the electrode is located.

3. The two-dimensional photonic crystal surface emitting laser according to claim 1, wherein:
    the reflection film is a thin metallic film provided further on an entire top surface of the main laser section, and an insulating film is provided between an outer surface of the main laser section and the reflection film except for a portion of a top surface of the main laser section; and
    the reflection film located at the portion of the top surface of the main laser section functions as an electrode.

4. The two-dimensional photonic crystal surface emitting laser according to claim 1, wherein the main laser section has a mesa structure.

5. The two-dimensional photonic crystal surface emitting laser according to claim 2, wherein the main laser section has a mesa structure.

6. The two-dimensional photonic crystal surface emitting laser according to claim 3, wherein the main laser section has a mesa structure.

\* \* \* \* \*